US009475088B2

(12) United States Patent
Kurosawa et al.

(10) Patent No.: US 9,475,088 B2
(45) Date of Patent: Oct. 25, 2016

(54) METHOD OF PRODUCING STRUCTURE CONTAINING PHASE-SEPARATED STRUCTURE, PHASE SEPARATED STRUCTURE, AND BLOCK COPOLYMER COMPOSITION

(71) Applicant: Tokyo Ohka Kogyo Co., Ltd., Kawasaki-shi (JP)

(72) Inventors: Tsuyoshi Kurosawa, Kawasaki (JP); Daiju Shiono, Kawasaki (JP); Ken Miyagi, Kawasaki (JP); Tasuku Matsumiya, Kawasaki (JP); Kenichiro Miyashita, Kawasaki (JP); Katsumi Ohmori, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 101 days.

(21) Appl. No.: 14/452,977

(22) Filed: Aug. 6, 2014

(65) Prior Publication Data

US 2015/0044371 A1   Feb. 12, 2015

(30) Foreign Application Priority Data

Aug. 9, 2013   (JP) ................. 2013-166687

(51) Int. Cl.
| | |
|---|---|
| *B05D 5/00* | (2006.01) |
| *C09D 153/00* | (2006.01) |
| *B05D 1/00* | (2006.01) |
| *B05D 3/02* | (2006.01) |
| *C08L 53/00* | (2006.01) |
| *G02B 1/111* | (2015.01) |
| *B81C 1/00* | (2006.01) |
| *B05D 1/34* | (2006.01) |

(52) U.S. Cl.
CPC ................. *B05D 5/00* (2013.01); *B05D 1/005* (2013.01); *B05D 3/02* (2013.01); *B81C 1/00031* (2013.01); *C08L 53/00* (2013.01); *C09D 153/00* (2013.01); *G02B 1/111* (2013.01); *B05D 1/34* (2013.01); *B81C 2201/0149* (2013.01)

(58) Field of Classification Search
None
See application file for complete search history.

(56) References Cited

U.S. PATENT DOCUMENTS

| | | | | |
|---|---|---|---|---|
| 2009/0186234 | A1* | 7/2009 | Colburn ................ | C08F 255/00 428/500 |
| 2012/0164392 | A1* | 6/2012 | Stoykovich ......... | B81C 1/00031 428/172 |

FOREIGN PATENT DOCUMENTS

JP   A-2008-036491   2/2008

OTHER PUBLICATIONS

Hinsberg et al., "Self-Assembling Materials for Lithographic Patterning: Overview, Status and Moving Forward," Proceedings of SPIE, Vo. 7637, 7637G-1 (2010).

\* cited by examiner

*Primary Examiner* — Michael P Rodriguez
(74) *Attorney, Agent, or Firm* — Knobbe Martens Olson & Bear LLP

(57) ABSTRACT

A method of producing a structure containing a phase-separated structure, including applying a neutralization film to a substrate to form a layer of a neutralization film; applying a block copolymer having a plurality of polymers bonded thereto, and a weight average molecular weight of 150,000 or more to the layer of the neutralization film, so as to form a layer containing the block copolymer and having a coating film thickness of 23 nm or less; and phase-separating the layer containing the block copolymer.

2 Claims, 1 Drawing Sheet

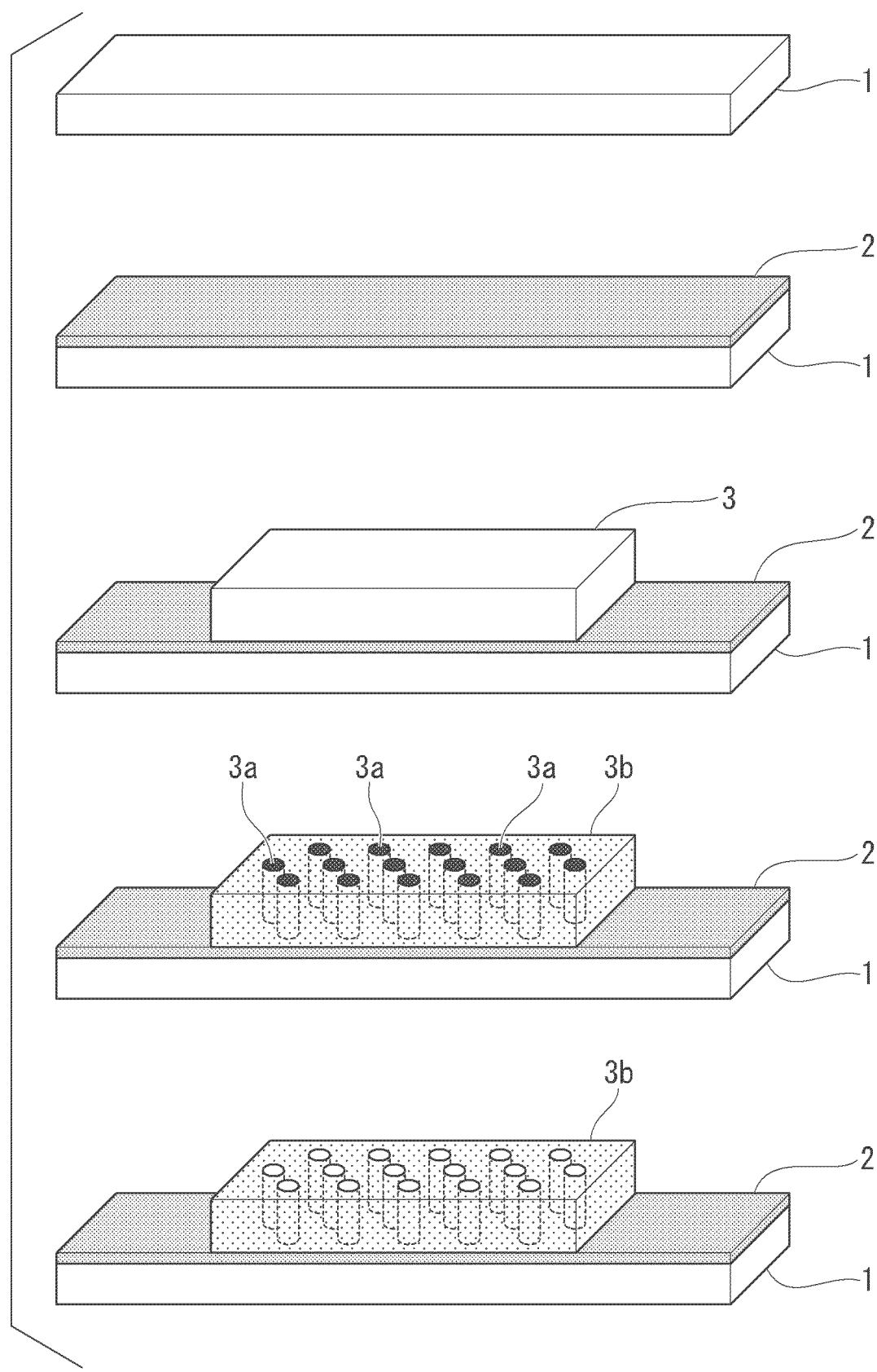

METHOD OF PRODUCING STRUCTURE CONTAINING PHASE-SEPARATED STRUCTURE, PHASE SEPARATED STRUCTURE, AND BLOCK COPOLYMER COMPOSITION

RELATED APPLICATIONS

This application claims priority under 35 U.S.C. §119(a)-(d) to Japanese Patent Application No. 2013-166687, filed Aug. 9, 2013, the content of which is incorporated herein by reference.

TECHNICAL FIELD

The present invention relates to a method of producing a structure containing a phase-separated structure, a phase separated structure, and a block copolymer composition.

DESCRIPTION OF RELATED ART

Recently, as further miniaturization of large scale integrated circuits (LSI) proceeds, a technology for processing a more delicate structure is demanded. In response to such demand, attempts have been started on forming a fine pattern using a phase-separated structure formed by self-assembly of block polymers having mutually incompatible blocks bonded together. (For example, Patent Literature 1).

For using a phase-separation structure of a block copolymer, it is necessary to form a self-organized nano structure by a microphase separation only in specific regions, and arrange the nano structure in a desired direction. For realizing position control and orientational control, processes such as graphoepitaxy to control phase-separated pattern by a guide pattern and chemical epitaxy to control phase-separated pattern by difference in the chemical state of the substrate are proposed (see, for example, Non-Patent Document 1).

In the chemical epitaxy process, a neutralization film containing a surface treatment agent which has affinity with any of the blocks that constitute the block copolymer is disposed on the substrate surface in a predetermined pattern. By the pattern (guide pattern) of the neutralization film disposed on the substrate surface, orientation of each phase of the phase-separated structure is controlled. Therefore, to form a predetermined phase-separated structure, it is important to dispose the neutralization film in accordance with a period of the block copolymer.

A block copolymer forms a regular periodic structure by phase separation. The periodic structure changes to a cylinder, a lamellar or a sphere, depending on the volume ratio or the like of the polymer components. Further, it is known that the period depends on the molecular weight.

Therefore, in the case of forming a relatively large pattern using a phase-separated structure formed by self-assembly of a block copolymer, it is considered that such pattern may be formed by increasing the molecular weight.

DOCUMENTS OF RELATED ART

Patent Literature

[Patent Document 1] Japanese Unexamined Patent Application, First Publication No. 2008-36491

Non-Patent Documents

[Non-Patent Document 1] Proceedings of SPIE (U.S.), vol. 7637, pp. 76730G-1 (2010)

SUMMARY OF THE INVENTION

As a result of the studies of the present inventors, it has been found that, in the case of forming a relatively large pattern using a phase-separated structure formed by self-assembly of a block copolymer, when the molecular weight is increased, a problem arises in that a desired phase-separated structure cannot be formed, e.g., a large variation in the phase-separated pattern.

The present invention takes the above circumstances into consideration, with an object of providing a method of producing a structure containing a phase-separated structure capable of forming a relatively large desired pattern by using a phase-separated structure of a block copolymer.

A first aspect of the present invention is a method of producing a structure containing a phase-separated structure, the method including: a step of applying a neutralization film to a substrate to form a layer of a neutralization film; a step of applying a block copolymer having a plurality of polymers bonded and a weight average molecular weight of 150,000 or more to the layer of the neutralization film, so as to form a layer containing the block copolymer and having a coating film thickness of 23 nm or less; and a step of phase-separating the layer containing the block copolymer.

A second aspect of the present invention is a phase-separated structure produced by the method according to the first aspect of the present invention.

A third aspect of the present invention is a block copolymer having a plurality of polymers bonded and a weight average molecular weight of 150,000 or more, used in the method of the first aspect of the present invention.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2=CH-COOH$) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" is a concept including styrene and compounds in which the hydrogen atom at the α-position of styrene is substituted with other substituent such as an alkyl group and a halogenated alkyl group.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The term "exposure" is used as a general concept that includes irradiation with any form of radiation.

According to the present invention, there is provided a method of producing a structure containing a phase-separated structure capable of forming a relatively large desired pattern by using a phase-separated structure of a block copolymer.

BRIEF DESCRIPTION OF THE DRAWINGS

FIG. 1 is a schematic diagram showing an example of one embodiment of the method of forming a pattern according to the present invention.

DETAILED DESCRIPTION OF THE INVENTION

<<Method of Producing Structure Containing Phase-Separated Structure>>

A method of producing a structure containing a phase-separated structure according to the present embodiment includes: a step of applying a neutralization film to a substrate to form a layer of a neutralization film; a step of applying a block copolymer having a plurality of polymers bonded and a weight average molecular weight of 150,000 or more to the layer of the neutralization film, so as to form a layer containing the block copolymer and having a film thickness of 23 nm or less; and a step of phase-separating the layer containing the block copolymer.

[Step of Applying a Neutralization Film to a Substrate to Form a Layer of the Neutralization Film]

First, a neutralization film containing a surface treating agent is formed on a substrate.

<Substrate>

There are no particular limitations on the type of a substrate, provided that the block copolymer-containing solution can be coated on the surface of the substrate. Examples of the substrate include a substrate constituted of an inorganic substance such as a metal (e.g., silicon, copper, chromium, iron or aluminum), glass, titanium oxide, silica or mica; and a substrate constituted of an organic substance such as an acrylic plate, polystyrene, cellulose, cellulose acetate or phenol resin.

Further, the size and the shape of the substrate used in the present invention are not particularly limited. The substrate does not necessarily need to have a smooth surface, and a substrate made of various materials and having various shapes can be appropriately selected for use. For example, a multitude of shapes can be used, such as a substrate having a curved surface, a plate having an uneven surface, and a thin sheet.

Further, on the surface of the substrate, an inorganic and/or organic film may be provided. As the inorganic film, an inorganic antireflection film (inorganic BARC) can be used. As the organic film, an organic antireflection film (organic BARC) can be used.

Before forming a neutralization film on the substrate, the surface of the substrate may be washed. By washing the surface of the substrate, the later thin film forming step may be satisfactorily performed.

As the washing treatment, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying. Thereafter, a layer containing a block copolymer can be formed on the surface of the substrate.

<Neutralization Film Forming Step>

In the present embodiment, firstly, the substrate is subjected to a neutralization treatment. A neutralization treatment is a treatment in which the surface of the substrate is modified so as to have affinity for all polymers constituting the block copolymer. By the neutralization treatment, it becomes possible to prevent only phases of specific polymers to come into contact with the surface of the substrate by phase separation. For this reason, in order to form a phase-separated structure having a lamellar structure oriented in a direction perpendicular to the substrate surface, before forming a layer containing a block copolymer, it is preferable to form a layer of the neutralization film on the substrate surface depending on the type of the block copolymer to be used.

Specifically, a thin film (neutralization film) containing a surface treating agent having affinity for all polymers constituting the block copolymer is formed on the surface of the substrate.

As the neutralization film, a film composed of a resin composition can be used. The resin composition used as the surface treating agent can be appropriately selected from conventional resin compositions used for forming a thin film, depending on the type of polymers constituting the block copolymer. The resin composition used as the surface treating agent may be a heat-polymerizable resin composition, or a photosensitive resin composition such as a positive resist composition or a negative resist composition.

Alternatively, a compound may be used as the surface treating agent, and the compound may be coated to form a non-polymerizable film as the neutralization film. For example, a siloxane organic monomolecular film formed by using a surface treating agent such as phenethyltrichlorosilane, octadecyltrichlorosilane or hexamethyldisilazane may be preferably used as a neutralization film.

The neutralization film composed of such surface treating agent can be formed by a conventional method.

Examples of the surface treating agent include a resin composition containing all structural units of the polymers constituting the block copolymer, and a resin containing all structural units having high affinity for the polymers constituting the block copolymer.

For example, when a PS-PMMA block copolymer (described later) is used, as the surface treating agent, it is preferable to use a resin composition containing both PS and PMMA as the structural units, or a compound or a composition containing both a portion having a high affinity for PS such as an aromatic ring and a portion having a high affinity for PMMA such as a functional group with high polarity.

Examples of the resin composition containing both PS and PMMA as the structural units include a random copolymer of PS and PMMA, and an alternating polymer of PS and PMMA (a copolymer in which the respective monomers are alternately copolymerized).

Examples of the composition containing both a portion having a high affinity for PS and a portion having a high affinity for PMMA include a resin composition obtained by polymerizing at least a monomer having an aromatic ring and a monomer having a substituent with high polarity. Examples of the monomer having an aromatic ring include a monomer having a group in which one hydrogen atom has been removed from the ring of an aromatic hydrocarbon, such as a phenyl group, a biphenyl group, a fluorenyl group, a naphthyl group, an anthryl group or a phenanthryl group, or a monomer having a hetero aryl group such as the aforementioned group in which part of the carbon atoms constituting the ring of the group has been substituted with a hetero atom such as an oxygen atom, a sulfur atom or a nitrogen atom. Examples of the monomer having a substituent with high polarity include a monomer having a trimethoxysilyl group, a trichlorosilyl group, a carboxy group, a hydroxy group, a cyano group or a hydroxyalkyl group in which part of the hydrogen atoms of the alkyl group has been substituted with fluorine atoms.

Examples of the compound containing both a portion having a high affinity for PS and a portion having a high affinity for PMMA include a compound having both an aryl group such as a phenethyltrichlorosilane and a substituent with high polarity, and a compound having both an alkyl group and a substituent with high polarity, such as an alkylsilane compound.

Further, in the present embodiment, as described later, a pattern of a photosensitive resin may be formed on the neutralization film. Therefore, in consideration of the adhesiveness of the pattern, the neutralization film preferably exhibits a polarity close to that of the photosensitive resin composition.

[Step of Applying a Block Copolymer having a Plurality of Polymers Bonded and a Weight Average Molecular Weight of 150,000 or More to the Layer of the Neutralization Film, so as to Form a Layer Containing the Block Copolymer and having a Film Thickness of 23 nm or Less]

In the present embodiment, after the previous step (step of applying a neutralization film to a substrate to form a layer of the neutralization film), a layer containing a block copolymer having a plurality of polymers bonded and a weight average molecular weight of 150,000 or more is formed on the layer of the neutralization film, the layer of the block copolymer having a coating film thickness of 23 nm or less.

More specifically, a block copolymer having a weight average molecular weight of 150,000 or more dissolved in a suitable organic solvent is applied to the surface of the neutralization film using a spinner or the like.

The organic solvent for dissolving the block copolymer will be described later.

In the present embodiment, the layer containing the block copolymer formed on the substrate surface has a thickness (hereafter, referred to as coating film thickness) of 23 nm or less.

In the present embodiment, the coating film thickness of the layer containing the block copolymer is preferably 22 nm or less, and more preferably 20 nm or less.

In the case where the coating film thickness is no more than the upper limit of the above-mentioned range, when a block copolymer having a weight average molecular weight of 150,000 is used, it is presumed that the block copolymer is affected by the neutralization film, and the orientation of each phase of the phase-separated structure can be controlled, thereby enabling the phase-separation.

In the present embodiment, the lower limit of the coating film thickness of the layer containing the block copolymer is not particularly limited, as long as it is sufficient for causing phase separation. In consideration of the strength of the nanostructure and the uniformity of the substrate having the nanostructure formed, the thickness of the layer is preferably 3 nm or more, and more preferably 5 nm or more.

<Block Copolymer>

In the present embodiment, a block copolymer is a polymer having a plurality of partial constituent components (blocks) in which only the same structural units are bonded, the plurality of partial constituent components (blocks) being bonded, and the block polymer has a weight average molecular weight of 150,000 or more. As the blocks constituting the block copolymer, 2 types of blocks may be used, or 3 or more types of blocks may be used. In the present invention, the plurality of blocks constituting the block copolymer are not particularly limited, as long as they are combinations capable of causing phase separation. However, it is preferable to use a combination of blocks which are mutually incompatible. Further, it is preferable to use a combination in which a phase of at least one block amongst the plurality of blocks constituting the block copolymer can be easily subjected to selective removal as compared to the phases of other blocks. An example of a combination which can be selectively removed reliably include a block copolymer in which one or more blocks having an etching selectivity of more than 1 are bonded.

In the present specification, a "period of a block copolymer" refers to a period of a phase structure observed when a phase-separated structure is formed, and is a sum of the lengths of the phases which are mutually incompatible. The period of a block copolymer corresponds to the length of 1 molecule of the block copolymer.

The period of a block polymer is determined by intrinsic polymerization properties such as the polymerization degree N and the Flory-Huggins interaction parameter $\chi$. Specifically, the repulsive interaction between different block components of the block copolymer becomes larger as the $\chi N$ becomes larger. Therefore, when $\chi N=10$ (hereafter, referred to as "strong segregation limit"), there is a strong tendency for the phase separation to occur between different blocks in the block copolymer. At the strong segregation limit, the period of the block copolymer is approximately $N^{2/3}\chi^{1/6}$. That is, the period of the block copolymer is in proportion to the polymerization degree N which correlates with the molecular weight Mn and molecular weight ratio between different blocks. Therefore, by adjusting the composition and the total molecular weight of the block copolymer to be used, the period of the block copolymer can be easily adjusted.

Examples of the block copolymer include a block copolymer in which a block of a structural unit having an aromatic group is bonded to a block of a structural unit derived from an (α-substituted) acrylate ester; a block copolymer in which a block of a structural unit having an aromatic group is bonded to a block of a structural unit derived from an (α-substituted) acrylic acid; a block copolymer in which a block of a structural unit having an aromatic group is bonded to a block of a structural unit derived from siloxane or a derivative thereof; a block copolymer in which a block of a structural unit derived from an alkyleneoxide is bonded to a block of a structural unit derived from an (α-substituted) acrylate ester; a block copolymer in which a block of a structural unit derived from an alkyleneoxide is bonded to a block of a structural unit derived from an (α-substituted) acrylic acid; a block copolymer in which a block of a structural unit containing a polyhedral oligomeric silsesquioxane structure is bonded to a block of a structural unit derived from an (α-substituted) acrylate ester; a block copolymer in which a block of a structural unit containing a polyhedral oligomeric silsesquioxane structure is bonded to a block of a structural unit derived from an (α-substituted) acrylic acid; and a block copolymer in which a block of a structural unit containing a polyhedral oligomeric silsesquioxane structure is bonded to a block of a structural unit derived from siloxane or a derivative thereof.

In the present embodiment, the block copolymer preferably includes a structural unit having an aromatic group and a structural unit derived from an (α-substituted) acrylic acid or an (α-substituted) acrylate ester.

Examples of the structural unit having an aromatic group include structural units having a phenyl group, a naphthyl group or the like. In the present embodiment, a structural unit derived from styrene or a derivative thereof is preferable.

Examples of the styrene or derivative thereof include α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, 4-vinylbenzylchloride, 1-vinylnaphthalene, 4-vinylbiphenyl, 1-vinyl-2-pyrolidone, 9-vinylanthracene, and vinylpyridine.

An (α-substituted) acrylic acid refers to either or both acrylic acid and a compound in which the hydrogen atom bonded to the carbon atom on the α-position of acrylic acid has been substituted with a substituent. As an example of such a substituent, an alkyl group of 1 to 5 carbon atoms can be given.

Examples of (α-substituted) acrylic acid include acrylic acid and methacrylic acid.

An (α-substituted) acrylate ester refers to either or both acrylate ester and a compound in which the hydrogen atom bonded to the carbon atom on the α-position of acrylate ester has been substituted with a substituent. As an example of such a substituent, an alkyl group of 1 to 5 carbon atoms can be given.

Specific examples of the (α-substituted) acrylate ester include acrylate esters such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethane acrylate, and propyltrimethoxysilane acrylate; and methacrylate esters such as methyl methacrylate, ethyl methacrylate, propyl methacrylate, n-butyl methacrylate, t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethane methacrylate, and propyltrimethoxysilane methacrylate.

Among these, methyl acrylate, ethyl acrylate, t-butyl acrylate, methyl methacrylate, ethyl methacrylate, and t-butyl methacrylate are preferable.

Examples of siloxane or derivative thereof include dimethylsiloxane, diethylsiloxane, diphenylsiloxane, and methylphenylsiloxane.

Examples of the alkylene oxide include ethylene oxide, propylene oxide, isopropylene oxide and butylene oxide.

Specific examples of the structural unit containing a polyhedral oligomeric silsesquioxane structure include a structural unit represented by general formula (a0-1) shown below.

[Chemical Formula 1]

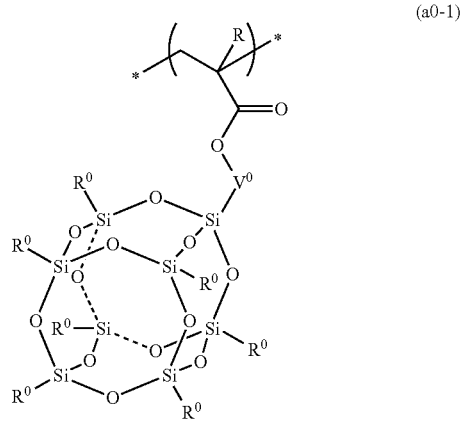

(a0-1)

In the formula, R represents a hydrogen atom, an alkyl group of 1 to 5 carbon atoms or a halogenated alkyl group of 1 to 5 carbon atoms; $V^0$ represents a divalent hydrocarbon group which may have a substituent; and $R^0$ represents a monovalent hydrocarbon group which may have a substituent, wherein the plurality of $R^0$ may be the same or different from each other.

In the aforementioned formula (a0-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a0-1), the monovalent hydrocarbon group for $R^0$ preferably contains 1 to 20 carbon atoms, more preferably 1 to 10 carbon atoms, and still more preferably 1 to 8 carbon atoms. However, this number of carbon atoms does not include any carbon atoms within any of the substituents described below.

The monovalent hydrocarbon group for $R^0$ may be an aliphatic hydrocarbon group or an aromatic hydrocarbon group, but is preferably an aliphatic hydrocarbon group, and more preferably a monovalent aliphatic saturated hydrocarbon group (alkyl group).

More specific examples of this alkyl group include chain-like aliphatic hydrocarbon groups (linear or branched alkyl groups), and aliphatic hydrocarbon groups that include a ring within the structure.

The linear alkyl group preferably contains 1 to 8 carbon atoms, more preferably 1 to 5 carbon atoms, and still more preferably 1 to 3 carbon atoms. Specific examples include a methyl group, an ethyl group, an n-propyl group, an isopropyl group, an n-butyl group, an isobutyl group and an n-pentyl group. Among these, a methyl group, an ethyl group or an n-propyl group is preferable, a methyl group, an ethyl group or an isobutyl group is more preferable, and an ethyl group is most preferable.

The branched alkyl group preferably has 3 to 5 carbon atoms. Specific examples of such branched alkyl groups include an isopropyl group, an isobutyl group, a tert-butyl group, an isopentyl group and a neopentyl group, and an isopropyl group or a tert-butyl group is particularly desirable.

As examples of the hydrocarbon group containing a ring in the structure thereof, a cyclic aliphatic hydrocarbon group (a group in which 1 hydrogen atom has been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic hydrocarbon group is interposed within the aforementioned chain-like aliphatic hydrocarbon group, can be given.

The cyclic aliphatic hydrocarbon group preferably has 3 to 8 carbon atoms, and more preferably 4 to 6 carbon atoms. The cyclic aliphatic hydrocarbon group may be either a polycyclic group, or a monocyclic group. As the monocyclic group, a group in which 1 or more hydrogen atoms have been removed from a monocycloalkane of 3 to 6 carbon atoms is preferable. Examples of the monocycloalkane include cyclopentane and cyclohexane. As the polycyclic group, a group in which 1 or more hydrogen atom has been removed from a polycycloalkane of 7 to 12 carbon atoms is preferable. Examples of the polycycloalkane include adamantane, norbornane, isobornane, tricyclodecane and tetracyclododecane.

The chain-like aliphatic hydrocarbon group may have a substituent. Examples of the substituent include a fluorine atom, a fluorinated alkyl group of 1 to 5 carbon atoms, and an oxygen atom (=O).

The cyclic aliphatic hydrocarbon group may have a substituent. Examples of the substituent include an alkyl group of 1 to 5 carbon atoms, a fluorine atom, a fluorinated alkyl group of 1 to 5 carbon atoms, and an oxygen atom (=O).

In the case where the monovalent hydrocarbon group for $R^0$ is an aromatic hydrocarbon group, the aromatic hydrocarbon group is a monovalent hydrocarbon group having at least 1 aromatic ring.

The aromatic ring is not particularly limited, as long as it is a cyclic conjugated compound having (4n+2)π electrons, and may be either monocyclic or polycyclic. The aromatic ring preferably has 5 to 30 carbon atoms, more preferably 5 to 20, still more preferably 6 to 15, and most preferably 6 to 12. However, this number of carbon atoms does not include any carbon atoms within any of the substituents described below.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom.

Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group).

The alkylene group which is bonded to the aforementioned aryl group or heteroaryl group preferably has 1 to 4 carbon atoms, more preferably 1 or 2 carbon atoms, and most preferably 1 carbon atom.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

In formula (a0-1), the divalent hydrocarbon group for $V^0$ may be either an aliphatic hydrocarbon group or an aromatic hydrocarbon group. An "aliphatic hydrocarbon group" refers to a hydrocarbon group that has no aromaticity.

The aliphatic hydrocarbon group as the divalent hydrocarbon group for $V^0$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—($CH_2$)$_2$—], a trimethylene group [—($CH_2$)$_3$—], a tetramethylene group [—($CH_2$)$_4$—] and a pentamethylene group [—($CH_2$)$_5$—].

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane.

As the polycyclic group, a group in which 2 hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20, still more preferably 6 to 15, and most preferably 6 to 12. However, this number of carbon atoms does not include any carbon atoms within any of the substituents described below.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group).

The alkylene group which is bonded to the aforementioned aryl group or heteroaryl group preferably has 1 to 4 carbon atoms, more preferably 1 or 2 carbon atoms, and most preferably 1 carbon atom.

Specific examples of structural unit represented by formula (a0-1) are shown below. In the formulae shown below, $R^\alpha$ represents a hydrogen atom, a methyl group or a trifluoromethyl group.

[Chemical Formula 2]

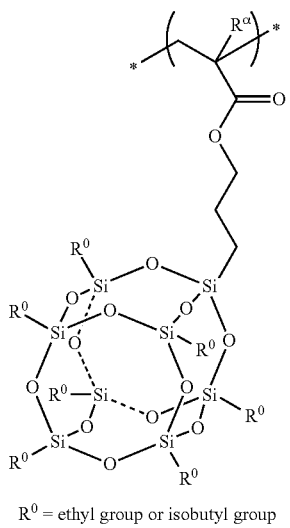

R⁰ = ethyl group or isobutyl group

In the present embodiment, the molar ratio of the structural unit having an aromatic group to the structural unit derived from an (α-substituted) acrylic acid or (α-substituted) acrylate ester is preferably in the range of 60:40 to 90:10, and more preferably 65:35 to 80:20.

When the ratio of the structural unit having an aromatic group to the structural unit derived from an (α-substituted) acrylic acid or (α-substituted) acrylate ester is within the above-mentioned preferable range, a cylindrical phase-separated structure oriented in a direction perpendicular to the substrate surface may be obtained.

Specific examples of such block copolymers include a block copolymer having a block of styrene and a block of acrylic acid; a block copolymer having a block of styrene and a block of methyl acrylate; a block copolymer having a block of styrene and a block of ethyl acrylate; a block copolymer having a block of styrene and a block of t-butyl acrylate; a block copolymer having a block of styrene and a block of methacrylic acid; a block copolymer having a block of styrene and a block of methyl methacrylate; a block copolymer having a block of styrene and a block of ethyl methacrylate; a block copolymer having a block of styrene and a block of t-butyl methacrylate; a block copolymer having a block of a structural unit containing a polyhedral oligomeric silsesquioxane (POSS) structure and a block of acrylic acid; and a block copolymers having a block of a structural unit containing a polyhedral oligomeric silsesquioxane (POSS) structure and a block of methyl acrylate.

In the present embodiment, the use of a block copolymer having a block of styrene and a block of methyl methacrylate is particularly preferred.

The weight average molecular weight (Mw) (the polystyrene equivalent value determined by gel permeation chromatography) of the block copolymer is 150,000 or more. In the present embodiment, the weight average molecular weight is preferably 160,000 or more, and more preferably 180,000 or more.

The polydispersity (Mw/Mn) of the block copolymer is preferably 1.0 to 3.0, more preferably 1.0 to 1.5, and still more preferably 1.0 to 1.3. Here, Mn is the number average molecular weight.

The period of the block copolymer depends on the weight average molecular weight. The larger the weight average molecular weight, the larger the period. In the present embodiment, when the weight average molecular weight is at least as large as the lower limit of the above-mentioned range, a relatively large phase-separated structure in which the period of the block copolymer is 50 nm or more can be obtained.

If desired, other miscible additives can also be added to the composition containing a block copolymer. Examples of such miscible additives include additive resins for improving the performance of the layer of the neutralization film, surfactants for improving the applicability, dissolution inhibitors, plasticizers, stabilizers, colorants, halation prevention agents, dyes, sensitizers, base amplifiers and basic compounds.

Organic Solvent

The composition containing a block copolymer may be prepares by dissolving the block copolymer in an organic solvent. The organic solvent may be any organic solvent which can dissolve the respective components to give a uniform solution, and one or more kinds of any organic solvent can be appropriately selected from those which have been conventionally known as solvents for a film composition containing a resin as a main component.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA: PGME weight ratio is preferably from 1:9 to 9:1, more preferably from 2:8 to 8:2, and still more preferably 3:7 to 7:3. Alternatively, when PGME and cyclohexanone is mixed as the polar solvent, the PGMEA: (PGME+cyclohexanone)

weight ratio is preferably from 1:9 to 9:1, more preferably from 2:8 to 8:2, and still more preferably 3:7 to 7:3.

Further, as the organic solvent for the composition containing a block copolymer, a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5.

The amount of the organic solvent in the composition containing a block copolymer is not particularly limited, and is adjusted appropriately to a concentration that enables application of a coating solution depending on the thickness of the coating film. In general, the organic solvent is used in an amount that yields a solid content for the block copolymer that is within a range from 0.2 to 70% by weight, and preferably from 0.2 to 50% by weight.

Hereafter, among the blocks constituting the block copolymer, in an optional step described later, a block which is not selectively removed is referred to as "block $P_A$", and a block to be selectively removed is referred to as "block $P_B$". For example, after the phase separation of a layer containing a PS-PMMA block copolymer, by subjecting the layer to an oxygen plasma treatment or a hydrogen plasma treatment, the phase of PMMA is selectively removed. In such a case, PS is the block $P_A$, and PMMA is the block $P_B$.

In the present invention, the shape and size of the phase to be selectively removed (i.e., the phase of block $P_B$) is determined by the compositional ratio of the respective blocks constituting the block copolymer and the molecular weight of the block copolymer. For example, by making the compositional ratio per volume of the block $P_B$ within the block copolymer relatively small, a cylinder structure in which the phase of the block $P_B$ is present within the phase of the block $P_A$ in the form of a cylinder can be formed. On the other hand, by making the compositional ratio per volume of the $P_B$ block within the block copolymer about the same as that of the $P_A$ block, a lamellar structure in which the phase of the $P_A$ block and the phase of the $P_B$ block are alternately laminated can be formed. Further, by increasing the molecular weight of the block copolymer, the size of each phase can be increased.

Step of Phase-Separating a Layer Containing a Block Copolymer

In the present embodiment, after the previous step (Step of applying a block copolymer having a plurality of polymers bonded and a weight average molecular weight of 150,000 or more to the layer of the neutralization film, so as to form a layer containing the block copolymer and having a film thickness of 23 nm or less), the layer containing the block copolymer on the neutralization film is phase-separated.

The phase-separation of the layer containing a block copolymer (i.e., layer 3 is FIG. 1) is performed by heat treatment after the formation of the layer containing a block copolymer, thereby forming a phase-separated structure. The heat treatment is preferably conducted at a temperature at least as high as the glass transition temperature of the layer containing the block copolymer used and lower than the heat decomposition temperature. For example, in the case where the block copolymer is PS-PMMA (Mw: 18-18k), it is preferable to conduct a heat treatment at a temperature of 160 to 270° C. for 30 to 3,600 seconds.

Further, the heat treatment is preferably conducted in a low reactive gas such as nitrogen.

In the present embodiment, by the above heat treatment, a structure containing a phase separated structure in which the layer containing the block copolymer is phase-separated into a phase of $P_A$ block and a phase of $P_B$ block.

In the present embodiment, a phase-separated structure may be formed on the neutralization film.

In the present embodiment, by conducting the above steps, a structure containing a phase-separated structure formed along the photosensitive resin pattern can be obtained. That is, according to the present embodiment, it is considered that the orientation of the phase-separated structure becomes controllable.

In the present embodiment, a method in which a photosensitive resin composition or the like is used as a physical guide to control the orientation of the phase-separated pattern (graphoepitaxy) may be used.

<Optional Step>

In the present embodiment, after the [step of phase-separating a layer containing a block copolymer], a pattern may be formed by selectively removing a phase of at least one block of the plurality of blocks constituting the block copolymer from the layer containing the block copolymer.

Specifically, for example, after forming a phase-separated structure, from the layer containing a block copolymer on the substrate, at least a portion of the block within the $P_B$ block phase (phase 3a in FIG. 1) is selectively removed (decomposition into low molecules), so as to form a pattern. By selectively removing a portion of the block $P_B$ in advance, the solubility in a developing solution can be enhanced. As a result, the phase constituted of the block $P_B$ can be more reliably removed by selective removing than the phase constituted of the block $P_A$.

The selective removal treatment is not particularly limited, as long as it is a treatment capable of decomposing and removing the $P_B$ block without affecting the $P_A$ block. The selective removal treatment can be appropriately selected from any methods for removing a resin film, depending on the types of the $P_A$ block and the $P_B$ block. Further, when a neutralization film is formed on the surface of the substrate in advance, the neutralization film is removed together with the phase of the $P_B$ block. Examples of the removal treatment include an oxygen plasma treatment, an ozone treatment, a UV irradiation treatment, a heat decomposition treatment and a chemical decomposition treatment.

The substrate having a pattern formed by the phase-separation of the layer containing the block copolymer as described above may be used as it is, or a further heat treatment may be conducted to modify the shape of the polymeric nano structure on the substrate. The heat treatment is preferably conducted at a temperature at least as high as the glass transition temperature of the block copolymer used and lower than the heat decomposition temperature. Further, the heat treatment is preferably conducted in a low reactive gas such as nitrogen.

<<Phase-Separated Structure>>

The present invention provides a structure containing a phase-separated structure produced by the aforementioned method of a structure containing a phase-separated structure.

The structure containing a phase-separated structure according to the present embodiment includes a substrate, a neutralization film, and a phase-separated block copolymer.

In the structure containing a phase-separated structure according to the present embodiment, the substrate, the neutralization film and the block copolymer are the same as defined above.

In the phase-separated structure according to the present embodiment, the period of the block copolymer is preferably 50 nm or more, and more preferably 55 nm or more.

The phase-separated structure according to the present embodiment may have a regular periodic structure such as a cylinder, a lamellar or a sphere.

In the present embodiment, as shown in FIG. 1, a cylindrical phase-separated structure perpendicular to the substrate is preferable.

Conventionally, in the case of forming a cylindrical phase-separated structure using a block copolymer having a large weight average molecular weight, the block copolymer was oriented in parallel to the substrate, such that it was difficult to orient a phase-separated structure perpendicular to the substrate.

In contrast, by the method of forming a structure containing a phase-separated structure according to the present embodiment, even by using a block copolymer having a weight average molecular weight of 150,000 or more, a cylindrical phase-separated structure perpendicular to the substrate can be formed.

The reason is presumed that, when a block copolymer having a weight average molecular weight of 150,000 is used, the block copolymer is affected by the neutralization film, and the orientation of each phase of the phase-separated structure can be controlled. Further, it is presumed that, by virtue of the layer containing the block copolymer having a coating film thickness of 23 nm or less, a cylinder structure orientationally controlled by the influence of the neutralization film can be oriented perpendicular to the substrate.

<<Block Copolymer Composition>>

The block copolymer according to the present embodiment has a plurality of polymers bonded and a weight average molecular weight of 150,000 or more, the block copolymer composition being used in the aforementioned method of producing a structure containing a phase-separated structure.

The block copolymer composition according to the present embodiment is the same as defined above.

EXAMPLES

The present invention will be described more specifically with reference to the following examples, although the scope of the present invention is by no way limited by these examples.

Examples 1 to 11, Comparative Examples 1 to 12, Reference Examples 1 to 72

An organic anti-reflection film composition (product name: ARC29A, manufactured by Brewer Science Ltd.) was applied to an 8-inch silicon wafer using a spinner, and the composition was then baked on a hot plate at 205° C. for 60 seconds and dried, thereby forming an organic anti-reflection film having a film thickness of 82 nm.

To the organic anti-reflection film, as a neutralization film, a resin composition (a copolymer of styrene/3,4-epoxycyclohexylmethane methacrylate/propyltrimethoxysilane methacrylate=88/17/5 with Mw=43, 400 and Mw/Mn=1.77) adjusted to a concentration of 0.5 to 1.0% by weight with PGMEA was applied using a spinner, followed by baking at 250° C. for 1 minute and dried, thereby forming a layer of the neutralization film with a film thickness of 10 nm on the substrate.

Subsequently, on the layer of the neutralization film, a PGMEA solution of a PS-PMMA block copolymer shown in Tables 2 to 8 (BCP1 to BCP12) (2% by weight) was spin-coated (number of rotation: 1,500 rpm, 60 seconds). The coating film thickness of the layer of the block copolymer was as shown in Tables 2 to 8. Then, the substrate having the PS-PMMA block copolymer coated thereon was heated at 240° C. for 60 seconds while flowing nitrogen for annealing, thereby forming a phase-separated structure. The surface of the obtained substrate was observed with a scanning electron microscope SU8000 (manufactured by Hitachi High-Technologies). The period, weight average molecular weight (Mw), polydispersity (Mw/Mn) and compositional ratio (PS/PMMA) of each of BCP1 to BCP 12 are shown in Table 1.

TABLE 1

|  | Period (nm) | Mw | Mw/Mn | PS-PMMA (Compositional ratio) |
|---|---|---|---|---|
| BCP1 | 25 | 30000 | 1.12 | 71.8/28.2 |
| BCP2 | 35 | 65000 | 1.07 | 71.2/28.2 |
| BCP3 | 40 | 72000 | 1.04 | 51.7/48.3 |
| BCP4 | 42 | 80000 | 1.06 | 66.7/33.3 |
| BCP5 | 45 | 100000 | 1.09 | 80.2/19.8 |
| BCP6 | 48 | 109000 | 1.14 | 76.5/23.5 |
| BCP7 | 50 | 110000 | 1.1 | 81.6/18.4 |
| BCP8 | 56 | 168000 | 1.26 | 71.7/28.3 |
| BCP9 | 65 | 190000 | 1.08 | 65.1/34.9 |
| BCP10 | 70 | 200000 | 1.11 | 66/34 |
| BCP11 | 51 | 115000 | 1.10 | 78.1/21.9 |
| BCP12 | 53 | 119000 | 1.10 | 72.0/28.0 |

In the tables, A indicates that a cylindrical phase-separated structure perpendicular to the substrate was formed mostly over the entire substrate (more than 80% of the entire substrate by visual evaluation), B indicates that a cylindrical phase-separated structure perpendicular to the substrate was partially formed (more than 50% and 80% or less of the of the entire substrate by visual evaluation), and C indicates that a cylindrical phase-separated structure perpendicular to the substrate was not formed (50% or less of the entire substrate by visual evaluation).

TABLE 2

|  | BCP | Film thickness (nm) | Evaluation result |
|---|---|---|---|
| Example 1 | BCP8 | 16 | A |
| Example 2 | BCP8 | 18 | A |
| Example 3 | BCP8 | 20 | A |
| Example 4 | BCP8 | 22 | B |
| Example 5 | BCP9 | 16 | A |
| Example 6 | BCP9 | 18 | A |
| Example 7 | BCP9 | 20 | A |
| Example 8 | BCP9 | 22 | B |
| Example 9 | BCP10 | 16 | A |
| Example 10 | BCP10 | 18 | A |
| Example 11 | BCP10 | 20 | A |

TABLE 3

|  | BCP | Film thickness (nm) | Evaluation result |
|---|---|---|---|
| Comparative Example 1 | BCP8 | 24 | C |
| Comparative Example 2 | BCP8 | 26 | C |
| Comparative Example 3 | BCP8 | 28 | C |
| Comparative Example 4 | BCP8 | 30 | C |
| Comparative Example 5 | BCP9 | 24 | C |

TABLE 3-continued

| | BCP | Film thickness (nm) | Evaluation result |
|---|---|---|---|
| Comparative Example 6 | BCP9 | 26 | C |
| Comparative Example 7 | BCP9 | 28 | C |
| Comparative Example 8 | BCP9 | 30 | C |
| Comparative Example 9 | BCP10 | 24 | C |
| Comparative Example 10 | BCP10 | 26 | C |
| Comparative Example 11 | BCP10 | 28 | C |
| Comparative Example 12 | BCP10 | 30 | C |

TABLE 4

| | BCP | Film thickness (nm) | Evaluation result |
|---|---|---|---|
| Reference Example 1 | BCP1 | 16 | A |
| Reference Example 2 | BCP1 | 18 | A |
| Reference Example 3 | BCP1 | 20 | A |
| Reference Example 4 | BCP1 | 22 | A |
| Reference Example 5 | BCP1 | 24 | A |
| Reference Example 6 | BCP1 | 26 | A |
| Reference Example 7 | BCP1 | 28 | A |
| Reference Example 8 | BCP1 | 30 | A |
| Reference Example 9 | BCP2 | 16 | A |
| Reference Example 10 | BCP2 | 18 | A |
| Reference Example 11 | BCP2 | 20 | A |
| Reference Example 12 | BCP2 | 22 | A |
| Reference Example 13 | BCP2 | 24 | A |
| Reference Example 14 | BCP2 | 26 | A |
| Reference Example 15 | BCP2 | 28 | A |
| Reference Example 16 | BCP2 | 30 | A |
| Reference Example 17 | BCP3 | 16 | A |
| Reference Example 18 | BCP3 | 18 | A |
| Reference Example 19 | BCP3 | 20 | A |
| Reference Example 20 | BCP3 | 22 | A |
| Reference Example 21 | BCP3 | 24 | A |
| Reference Example 22 | BCP3 | 26 | A |
| Reference Example 23 | BCP3 | 28 | A |
| Reference Example 24 | BCP3 | 30 | A |

TABLE 5

| | BCP | Film thickness (nm) | Evaluation result |
|---|---|---|---|
| Reference Example 25 | BCP4 | 16 | A |
| Reference Example 26 | BCP4 | 18 | A |
| Reference Example 27 | BCP4 | 20 | A |
| Reference Example 28 | BCP4 | 22 | A |
| Reference Example 29 | BCP4 | 24 | A |
| Reference Example 30 | BCP4 | 26 | A |
| Reference Example 31 | BCP4 | 28 | A |
| Reference Example 32 | BCP4 | 30 | A |
| Reference Example 33 | BCP5 | 16 | A |
| Reference Example 34 | BCP5 | 18 | A |
| Reference Example 35 | BCP5 | 20 | A |
| Reference Example 36 | BCP5 | 22 | A |
| Reference Example 37 | BCP5 | 24 | A |
| Reference Example 38 | BCP5 | 26 | A |
| Reference Example 39 | BCP5 | 28 | A |
| Reference Example 40 | BCP5 | 30 | A |
| Reference Example 41 | BCP6 | 16 | A |
| Reference Example 42 | BCP6 | 18 | A |
| Reference Example 43 | BCP6 | 20 | A |
| Reference Example 44 | BCP6 | 22 | A |
| Reference Example 45 | BCP6 | 24 | A |
| Reference Example 46 | BCP6 | 26 | A |
| Reference Example 47 | BCP6 | 28 | A |
| Reference Example 48 | BCP6 | 30 | A |

TABLE 6

| | BCP | Film thickness (nm) | Evaluation result |
|---|---|---|---|
| Reference Example 49 | BCP7 | 16 | A |
| Reference Example 50 | BCP7 | 18 | A |
| Reference Example 51 | BCP7 | 20 | A |
| Reference Example 52 | BCP7 | 22 | B |
| Reference Example 53 | BCP7 | 24 | B |
| Reference Example 54 | BCP7 | 26 | B |
| Reference Example 55 | BCP7 | 28 | C |
| Reference Example 56 | BCP7 | 30 | C |

TABLE 7

|  | BCP | Film thickness (nm) | Evaluation result |
|---|---|---|---|
| Reference Example 57 | BCP11 | 16 | A |
| Reference Example 58 | BCP11 | 18 | A |
| Reference Example 59 | BCP11 | 20 | A |
| Reference Example 60 | BCP11 | 22 | B |
| Reference Example 61 | BCP11 | 24 | B |
| Reference Example 62 | BCP11 | 26 | B |
| Reference Example 63 | BCP11 | 28 | C |
| Reference Example 64 | BCP11 | 30 | C |

TABLE 8

|  | BCP | Film thickness (nm) | Evaluation result |
|---|---|---|---|
| Reference Example 65 | BCP12 | 16 | A |
| Reference Example 66 | BCP12 | 18 | A |
| Reference Example 67 | BCP12 | 20 | A |
| Reference Example 68 | BCP12 | 22 | B |
| Reference Example 69 | BCP12 | 24 | B |
| Reference Example 70 | BCP12 | 26 | B |
| Reference Example 71 | BCP12 | 28 | C |
| Reference Example 72 | BCP12 | 30 | C |

As seen from the results shown above, in each of Examples 1 to 11 using a block copolymer having a weight average molecular weight of 150,000 or more, by rendering the coating film thickness 16 to 22 nm, an excellent pattern could be formed.

In each of Comparative Examples 1 to 12 in which the coating film thickness was rendered 24 nm or more, an excellent pattern could not be formed using a block copolymer having a weight average molecular weight of 150,000 or more.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing a structure containing a phase-separated structure, the method comprising:
    applying a surface treating agent to a substrate to form a layer of a neutralization film;
    applying a block copolymer having a plurality of polymers bonded and a weight average molecular weight of 150,000 or more to the layer of the neutralization film, so as to form a layer containing the block copolymer and having a coating film thickness of 20 nm or less; and
    phase-separating the layer containing the block copolymer to form a cylindrical phase-separated structure perpendicular to the substrate,
    wherein the block copolymer comprises a structural unit having an aromatic group and a structural unit derived from an (α-substituted) acrylic acid or an (α-substituted) acrylate ester, a molar ratio of the structural unit having an aromatic group to the structural unit derived from an (α-substituted) acrylic acid or an (α-substituted) acrylate ester is in the range of 60:40 to 90:10, and
    the block copolymer has a period of 50 nm or more.

2. The method according to claim 1, wherein the neutralization film comprises a resin composition obtainable from a monomer having an aromatic ring and a monomer having a trimethoxysilyl group.

* * * * *